(12) United States Patent
Harper et al.

(10) Patent No.: US 8,344,722 B2
(45) Date of Patent: Jan. 1, 2013

(54) ELECTRIC CURRENT MEASUREMENT

(75) Inventors: Marcellus C. Harper, Kaysville, UT (US); William Picken, San Jose, CA (US); Yusuf Haque, Woodside, CA (US)

(73) Assignee: Crest Semiconductors, Inc., San Jose, CA (US)

( * ) Notice: Subject to any disclaimer, the term of this patent is extended or adjusted under 35 U.S.C. 154(b) by 423 days.

(21) Appl. No.: 12/781,316

(22) Filed: May 17, 2010

(65) Prior Publication Data

US 2011/0279133 A1 Nov. 17, 2011

(51) Int. Cl.
*G01R 19/00* (2006.01)
(52) U.S. Cl. ..................................... 324/76.11; 324/140
(58) Field of Classification Search ................ 324/76.11
See application file for complete search history.

(56) References Cited

U.S. PATENT DOCUMENTS

| 5,864,229 | A  | * | 1/1999  | Lund ............................. 324/240 |
| 6,487,515 | B1 | * | 11/2002 | Ghoshal ........................ 702/136 |
| 7,633,296 | B2 | * | 12/2009 | Safinya et al. ................ 324/347 |

* cited by examiner

*Primary Examiner* — Thomas Valone
(74) *Attorney, Agent, or Firm* — Steven L. Nichols; Van Cott, Bagley, Cornwall & McCarthy P.C.

(57) ABSTRACT

A method for measuring electric current applied to a load includes: with a sensor element having an inaccuracy, measuring an electric current supplied to a load to produce a measurement of the electric current; with the sensor element, measuring the electric current with an added perturbation current; and using measurements of the electric current taken with and without the perturbation current to refine the measurement of the electric current.

35 Claims, 8 Drawing Sheets

ELECTRIC CURRENT MEASUREMENT

BACKGROUND

Electrical current is defined as the flow of electric charge. The flow of electric charge is often realized through the flow of electrons through a conducting medium. Electric current traveling through a conducting medium may be used to send data signals or provide power to various devices. It is often beneficial to measure the amount of electric current being consumed by a particular device. For example, monitoring the actual electric current consumed by a particular device may enable better control over energy efficiency and energy costs.

One way of measuring current is to place a small resistor along the path of the desired current signal to be measured. By measuring the voltage drop across the resistor, the amount of current may be determined through Ohm's law. Ohm's law indicates that the electric current measured in amperes is equal to the voltage drop measured in volts divided by the value of the resistor measured in ohms. Although this method may provide a relatively accurate measurement of the current, it unnecessarily consumes power. Electrical energy carried by the electric current is transferred to thermal energy through the resistor. Thus, measurement of electric current through a resistor is not energy efficient and may create excessive heat.

There are methods known in the art for measuring electric current without requiring an additional resistor to be added to the circuit. These methods may be referred to as "lossless." One of these methods is to measure the voltage drop across the Direct Current Resistance (DCR) of the inductor which is part of a switched mode power supply. Again, through use of Ohm's law, the electric current can be determined by the voltage drop divided by the DCR of the inductor. However, the DCR of the inductor is not very accurate and drifts according to temperature changes. Thus, the accuracy of the current measured through this method is only as accurate as the value of the DCR resistance.

Another lossless measurement technique is to measure the voltage drop across the resistance ($R_{DS}$) between the drain and the source terminals of a Metal-Oxide Semiconductor Field-Effect Transistor (MOSFET) device. However, the value of $R_{DS}$ is also very inaccurate and drifts even more in response to temperature changes.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

As mentioned above, traditional methods of measuring electric current typically are energy inefficient or inaccurate. In light of these and other difficulties, the present specification relates to accurately measuring electric current through use of a perturbation current.

According to certain illustrative embodiments, an electric current may be applied to a load. A measuring device such as an Analog-to-Digital Converter may be used to measure the electric current flowing through a sensor element such as a resistor, inductor, or MOSFET device associated with the power supply circuit supplying electric current to the load. As mentioned above, the electric current measured may only be as accurate as the sensor element itself. For example, if the sensor element is a resistor having a 10% tolerance, than the resulting current measurement may have an inaccuracy of up to 10%. A known perturbation current may then be applied across the sensor element. This will affect the electrical current flowing through the sensor element. The affected electric current flowing through the sensor element may then be measured. From the two measurements taken and the known perturbation current, an accurate measurement of the electric current applied to the load may be determined.

Through use of systems and methods embodying principles described herein, accurate current measurement may be achieved for both lossy and lossless measurement techniques. Having an accurate electric current reading may allow for better management of power consumed. For example, if the electric current supplied reaches a predetermined threshold, additional circuitry may be used to reduce the amount of electric current consumed.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1:
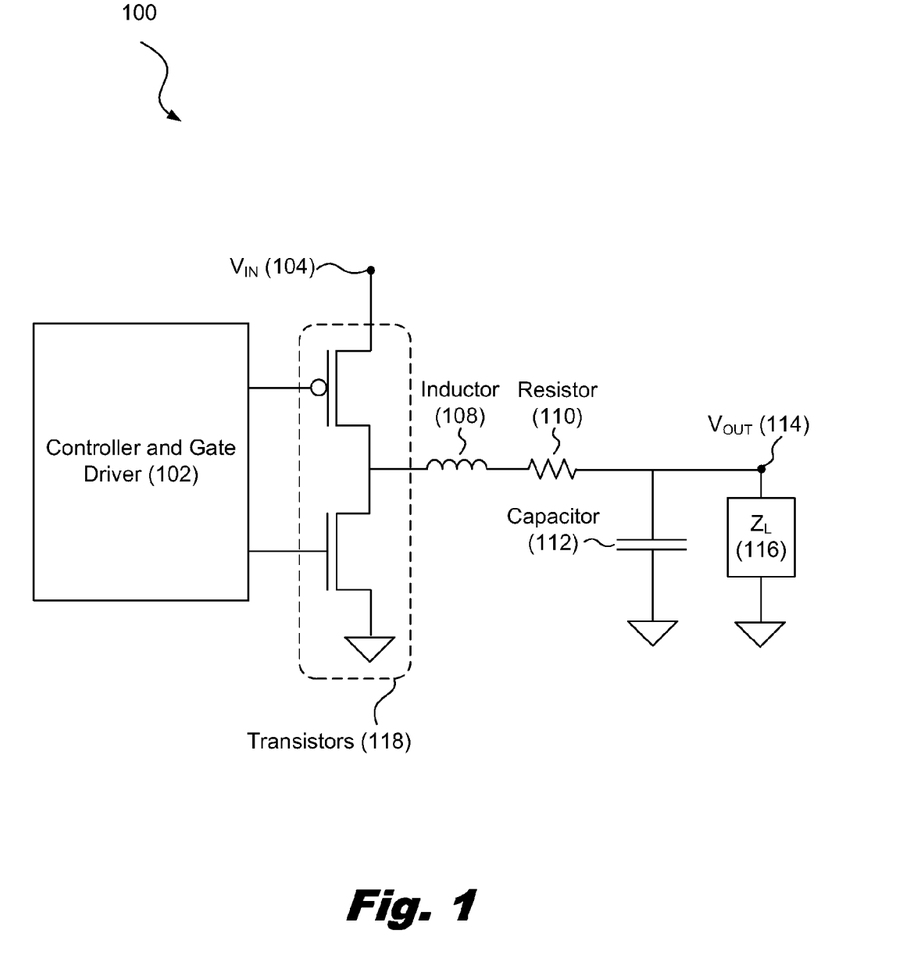
FIG. 1 is a diagram showing an illustrative circuit schematic of a switched mode power supply, according to one embodiment of principles described herein.

Referring now to the figures, FIG. 1 is a diagram showing an illustrative circuit schematic (100) of a switched mode power supply. According to certain illustrative embodiments, a switched mode power supply may include a controller and gate driver (102), a voltage input $V_{IN}$ node (104), an inductor (108), a resistor (110), a capacitor (112), and a voltage output $V_{OUT}$ node (114) where voltage or current is supplied to a load (116).

A switched mode power supply is often used to transfer power from a power source to a load (116). This process often involves transferring power at a higher voltage level to a lower voltage level. The switched mode power supply is operated by a controller and gate driver (102). The controller and gate driver (102) often includes integrated circuits configured to operate the transistors operating as switches. In general, a transistor operating as a switch includes an input and an output corresponding to the source terminal and the drain terminal of the transistor. The gate terminal of the transistor is connected to a switching signal such as a clock signal. In the case of the switched mode power supply, the controller and gate driver (102) are connected to the gates of the transistors (118) to control when the transistors (118) are in an ON or OFF state. A transistor in an ON state is essentially a closed switch and allows current to flow through the transistor. A transistor in an OFF state is essentially an open switch and prohibits the flow of electric current.

As a voltage applied at the input node (104), is connected to an inductor (108) via transistors (118) an electric current is formed across the inductor. An inductor (108) is a passive circuit element able to store energy from a passing electric current into a magnetic field. As mentioned above, an inductor exhibits an effective resistance indicated by the resistor (110) in FIG. 1. The current may then be supplied to a load (116) at the $V_{OUT}$ node (114). The capacitance (112) shown in FIG. 1 may be used to reduce fluctuation in the voltage supplied to the $V_{OUT}$ node (114). A load may refer to any device comprising electronic circuitry which exhibits an effective resistance.

As mentioned above, it is beneficial to have accurate measurements of the electric current supplied to a load. The applicant has discovered that by measuring a voltage drop across a sensor element with and without the application of a perturbation current across the sensor element, an accurate electric current measurement may be determined. The determined electric current measurement may be much more accurate than the tolerance levels of the sensor element.

Figure 2A:
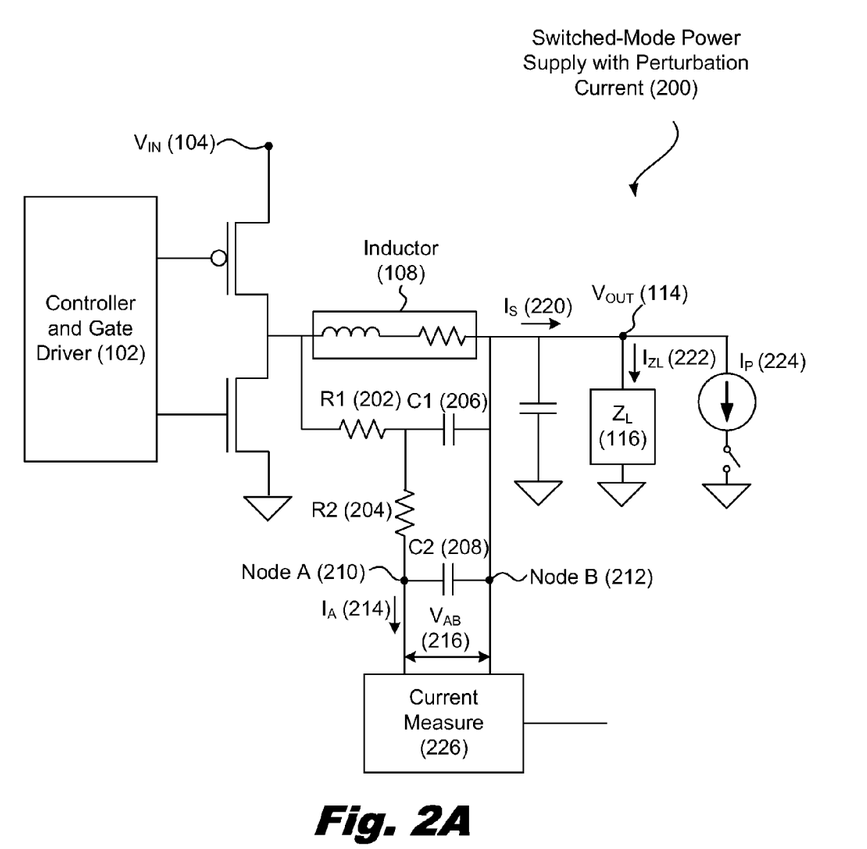
FIGS. 2A and 2B are illustrative diagrams showing an illustrative circuit schematic of a switched mode power supply with means for applying a perturbation current, according to one embodiment of principles described herein.

FIG. 2 is a diagram showing an illustrative circuit schematic (200) of a switched mode power supply with means for applying a perturbation current. According to certain illustrative embodiments, the switched mode power supply may include additional resistors (202, 204) and capacitors (206, 208) for creating a low-pass filter. Additionally, a perturbation current (224) may be used to effect a change in the supply current $I_S$ (220).

A perturbation current (224) may be supplied by either a source circuit or a sink circuit. If the perturbation current is supplied by a source circuit, the supply current (220) is reduced by the amount of the perturbation current such that for an unchanged load (224) the output voltage (114) remains constant. If the perturbation current (224) is supplied with a sink circuit, the supply current (220) is typically increased by the amount of the perturbation current such that for an unchanged load (224), the output voltage (114) remains constant. Thus, the supply current (220) is a combination of both the current $I_{ZL}$ (222) supplied to the load (116) and the perturbation current (224).

In some embodiments, a power supply may include current sensing circuitry with a low pass filter to eliminate transient signals. A low pass filter may be formed with a combination of resistors (202, 204) and capacitors (206, 208) as shown in FIG. 2. A low pass filter is designed to allow signals of low frequency to pass while inhibiting signals of a higher frequency. Thus, transient signals, which are sudden spikes in the signal sometimes caused by switching elements, may be reduced.

As mentioned above, one way to measure the supply current (220) is to measure the voltage drop across the inductor associated with the power supply. The supply current (220) may then be calculated by taking the voltage measured in volts and dividing it by the DCR of the inductor measured in ohms. However, the precise value of the DCR of the inductor is often unknown. Furthermore, the DCR value is very sensitive to changes in temperature. Thus, the resistance value is essentially an unknown value. The following equation may now be determined.

$$I_S = V_L/R \qquad \text{(Equation 1)}$$

Wherein $I_S$=the unknown electric current supplied;
$V_L$=the measured voltage drop across the inductor; and
R is the unknown DCR value of the inductor.

The above equation is unsolvable as only one variable is known. By applying a perturbation current (224), the following equation may be determined:

$$I_S + I_P = V_{LP}/R \qquad \text{(Equation 2)}$$

In which $I_S$=the supply current before perturbation is applied;
$I_P$=the known perturbation current;
$V_{LP}$=the measured voltage drop across the inductor with the perturbation current (224) applied; and
R is the unknown DCR value of the inductor.

As will be appreciated by one skilled in the art, a system of linear equations which includes two equations and two unknown variables is indeed solvable. The supply current (220) and the DCR value of the inductor are the two unknown variables. Thus, an accurate measurement of the supply current (220) may be determined.

The above described equations and measurements illustrate one method of measuring and calculating the value of the supply current (220). Other calculation methods may be used as well. For example, instead of measuring the filtered inductor voltage drop at $V_{AB}$ (216) an electric current $I_A$ (214) drawn from node A (210) may be adjusted so that the voltage drop $V_{AB}$ (216) between node A (210) and node B (212) is zero. An electric current measure device (226) may then measure the current $I_A$ (214) which is proportional to $I_S$ when $V_{AB}$ (216) is zero. Through methods similar to the one shown above, two equations may be determined. One equation may be determined without the perturbation current (224) applied and one equation may be determined without the perturbation current (224) applied. From these two equations, an accurate measurement of the supply current (220) may be calculated.

In some cases, the load (116) may create unpredictable fluctuations in $I_{ZL}$ (222). One way to compensate for these cases may be to take multiple measurements with the perturbation current (224) applied at varying time intervals. The duration of each time interval may vary as well. These measurements may be taken at irregular intervals to lessen the possibility of cyclic current changes in $I_{ZL}$ (222) from causing an error in the measurement algorithm. An average measurement may then be determined. Additionally, disparate measurements (outliers) due to spikes or charge injections caused from switching may be removed from the data used to determine an average value of the multiple measurements.

In some embodiments, the application of the perturbation current (224) may cause fluctuations in the load voltage (114). This may cause transients in the supply current (220). Thus, a measurement taken soon after the perturbation current (224) is applied or removed may be slightly inaccurate. This can be compensated for algorithmically by not using data taken during a known transient time. For example, if multiple measurements are taken with the perturbation current (224) applied and one of the measurements is outside the general range of the other measurements, then the outlying measurement may be discarded.

In some embodiments, the perturbation current (224) applied to the sensor element may vary over time. Using multiple measurements taken with different levels of perturbation current may provide additional characteristics including, but not limited to non-linearity and offset of the sensor element.

In some embodiments, additional circuitry or an algorithm may be used to adjust the electric current supplied based on the measured current value. For example, in some cases, $I_S$ (220) may have a limit on the amount of electric current which may be supplied. In such cases, additional circuitry may be used to adjust the supply current (220) in response to a determination that the present supply current (220) is not at a desired level. In one example, high performance server systems may have a limit as to how much power should be consumed. If the electric current consumed reaches a predetermined threshold, then the server may be configured to transfer some of its processing load to another server which may currently be processing a lighter load. Thus, the processing resources of multiple servers may be balanced.

Figure 2B:
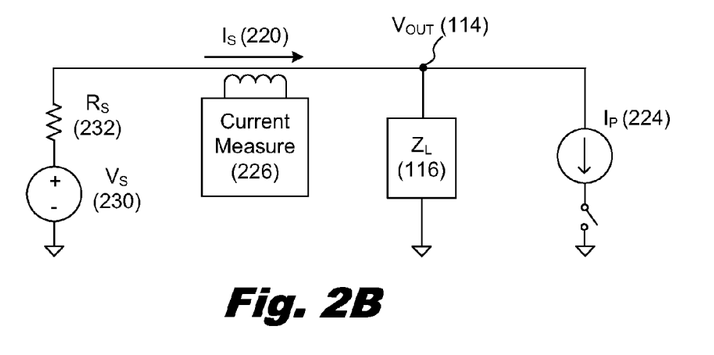

In some cases, a voltage supply may be poorly regulated, as shown in FIG. 2B where the supply (230) has a significant output resistance Rs (232). In this case $V_{OUT}$ (114) will change as the perturbation current (224) is being injected. In such cases, the sensor accuracy may still be improved by observing how $V_{OUT}$ (114) responds to the perturbation current (224). These observations may be used algorithmically to further reduce the sensor inaccuracy. For example, if the supply has output impedance $R_S$, then $V_{OUT}$ (114) will fluctuate depending on the load (116) and the perturbation current (224). If the load is purely resistive, it can be shown that $\Delta I_S$ ($I_S$ with $I_P$ on minus $I_S$ with $I_P$=0) is:

$$\Delta I_S = I_P \times Z_L / (R_S + Z_L) \quad \text{(Equation 3)}$$

in which $\Delta I_S$ is the change in supply current between having the perturbation current applied and not applied;
$I_P$ is the perturbation current;
$Z_L$ is the load; and
$R_S$ is the output impedance.

If it is known that nominally $Z_L=10 \times R_S$ and both components have a 10% tolerance, then it may be known that nominally $\Delta I_S$ is 10/(1+10)=90.9% of a change in the perturbation current (224). Given the 10% tolerance $\Delta I_{SMAX}=11/(0.9+11)=92.4\%$ and $\Delta I_{SMIN}=9/(1.1+9)=89.1\%$, which means that even though $V_{OUT}$ (114) is not regulated, then the supply will be change by 90.9%+1.5%/−1.8% of a given perturbation current (224). This known change in the supply current may be accurate enough to improve many sensors with an initial tolerance of, for example 10%.

Figure 3:
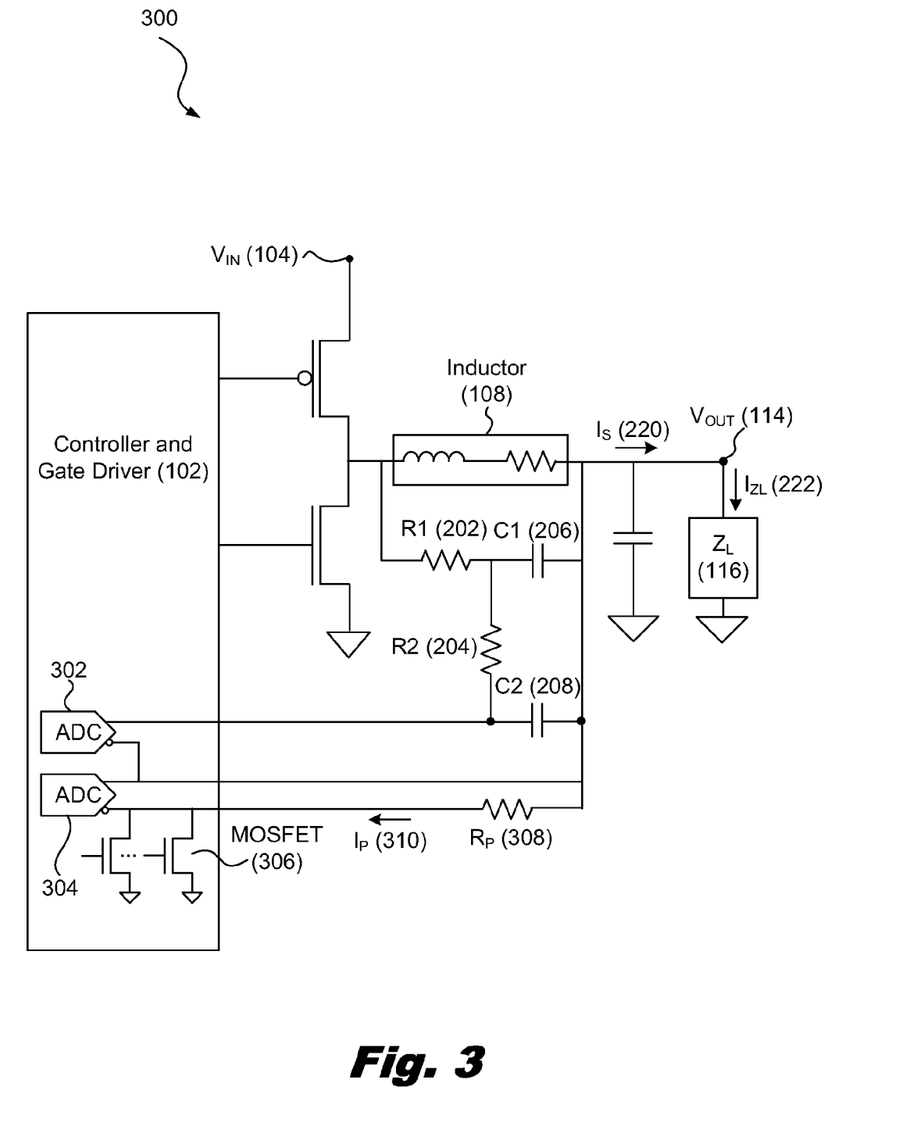
FIG. 3 is a diagram showing an illustrative circuit schematic of a switched mode power supply with MOSFET devices used for applying a perturbation current, according to one embodiment of principles described herein.

FIG. 3 is a diagram showing an illustrative circuit schematic (300) of a switched mode power supply with MOSFET devices (306) used for applying a perturbation current (310). According to certain illustrative embodiments, a number of MOSFET devices (306) in parallel may be used to apply a perturbation current (310). Analog-to-Digital converters (302, 304) may be used to measure the perturbation current (310) applied.

In some embodiments, the perturbation current may be applied gradually. Doing so may prevent unwanted fluctuations on the node. One way to apply the perturbation current (310) gradually is to selectively switch a number of MOSFET devices (306) into an ON state, each MOSFET device being connected to a summing node. Because each MOSFET has an associated drain to source impedance, each MOSFET added in parallel will add more electric current to the final perturbation current (310) value. By successively ramping up to the full value of the perturbation current (310), the load current (222) is less likely to experience a sudden fluctuation. Another way to reduce sudden current fluctuation is to gradually bias the MOSFET(s) on by using an analog signal to drive the MOSFET gate instead of a digital switching signal.

The technique of switching in varied magnitudes of perturbation current may be used to determine linearity, gain and offset error of the current sensor.

The capability to switch in varied magnitudes of perturbation current at adjustable rates also can be used to determine accurate values for other circuit parameters such as capacitance, voltage or system response time constants that are useful in adjusting the power supply feedback loop and thereby reduce ripple in supplied power.

In order to obtain a measurement of the perturbation current (310), the voltage drop across a resistor may be measured. The perturbation current (310) may then be determined by taking the measured voltage drop and dividing it by the value of the resistor. When resistor circuit elements are manufactured, they are often marked with a tolerance value. For example, if a 100 ohm resistor is marked with a ten percent tolerance value, the actual resistance of the resistor may range from 90-110 ohms. With a ten percent tolerance, an electric current measurement based on a voltage drop across the resistor may be off by up to ten percent.

Precision resistors are available which have a tolerance of less than one percent. Thus, a measurement of the perturbation current (310) taken by measuring the voltage drop across a precision resistor $R_P$ (308) may be accurate within one percent.

In some embodiments, the sensing resistor may be internal to the integrated circuits associated with the controller and gate driver (102). Additionally or alternatively, the resistance ($R_{DSON}$) across the MOSFET device (306) between the drain and the source when the MOSFET device (306) is in an ON state may be used as the sensing resistor. However, the resistance value of resistors which are manufactured as part of an integrated circuit and resistance associated with the MOSFET device (306) drift greatly with temperature. Thus, in embodiments that use these resistances for sensing current, additional means may be required to increase the accuracy. For example, the characteristics of the MOSFET device (306) may be determined beforehand. Additionally, a sensor may determine the temperature currently experienced by the circuit. Thus, a calculation may take into account the device characteristics and temperature to determine an accurate resistance value. The accurate resistance value may then allow for an accurate determination of the perturbation current (310).

An ADC (302, 304) is a circuit device configured to detect an analog signal and produce a digital signal. ADC devices (302, 304) typically comprise a number of comparators that compare voltage or electric current signals to reference signals and in turn output a digital value. Thus, ADC (302, 304) devices may be used to detect an electric current value and output a digital representation of that value. In some embodiments, a Voltage-to-Frequency Converter may be used to measure the perturbation current (310).

Figure 4:
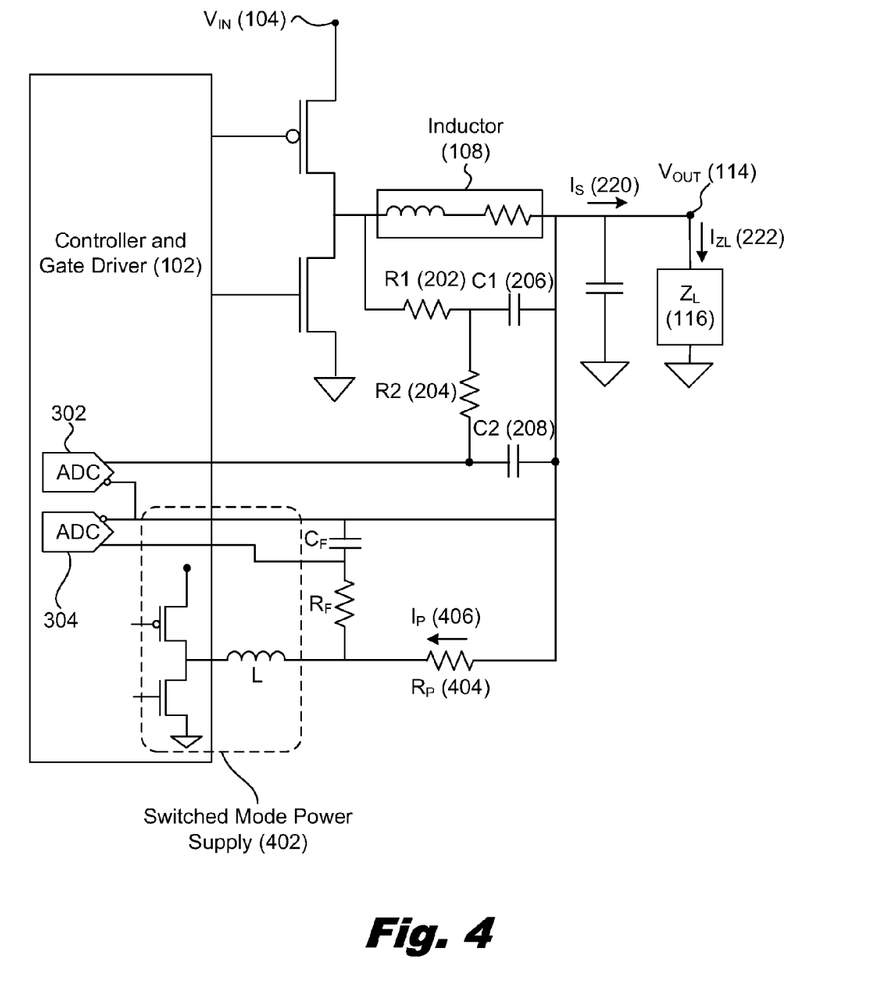
FIG. 4 is a diagram showing an illustrative circuit schematic of a switched mode power supply in which a perturbation current is applied through an additional switched mode power supply, according to one embodiment of principles described herein.

FIG. 4 is a diagram showing an illustrative circuit schematic (400) of a switched mode power supply in which a perturbation current (406) is sourced through an additional switched mode power supply. According to certain illustrative embodiments, an additional switched mode power supply (402) may apply the perturbation current (406). A precision resistor (404) may be used to measure the perturbation current (406) applied.

In some embodiments, the input voltage may be much higher than the output voltage. In such embodiments, it may be more efficient to use an additional switched mode power supply (402) to inject the perturbation current (406). As with earlier described embodiments, the perturbation current (406) may be determined by measuring the voltage drop across a precision resistor (404).

Figure 5:
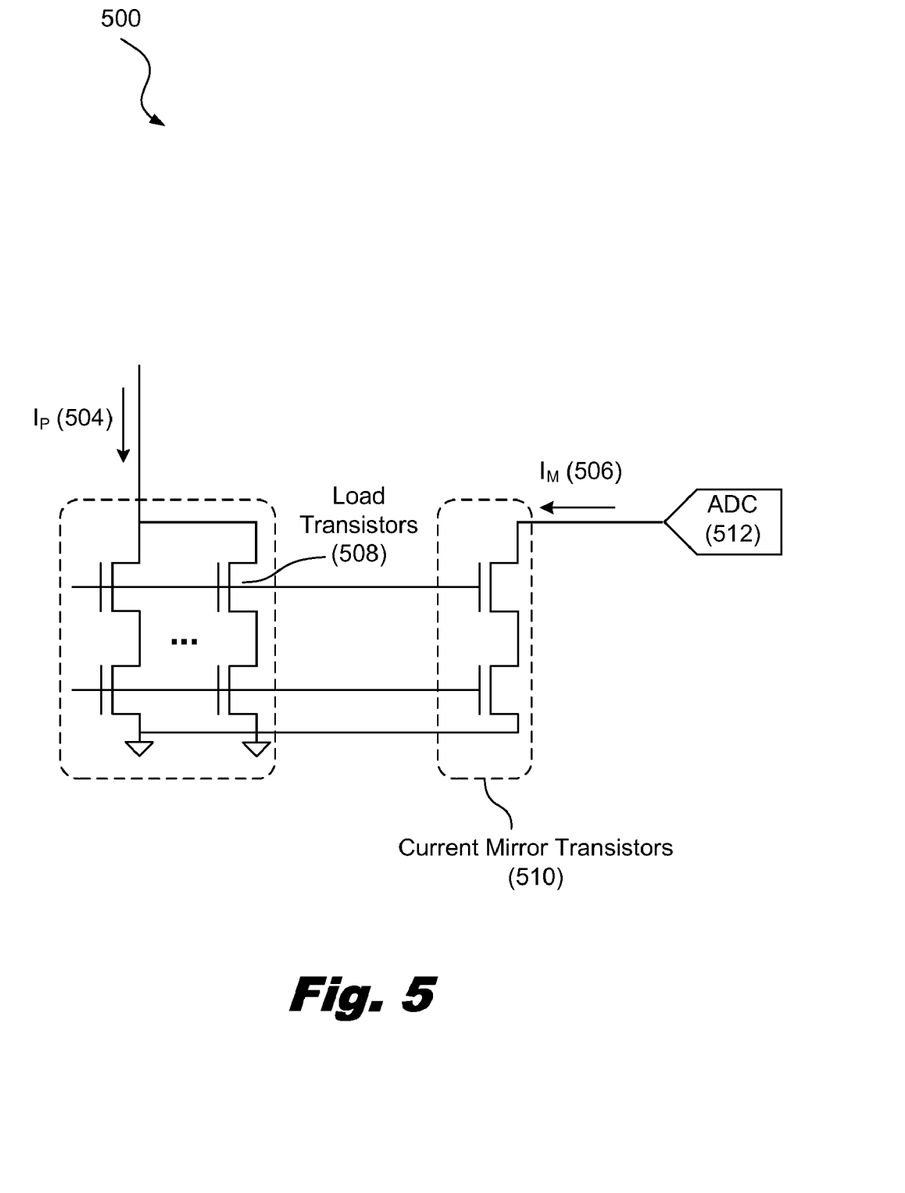
FIG. 5 is a diagram showing an illustrative circuit schematic of a source circuit which may be used to provide a perturbation current, according to one embodiment of principles described herein.

FIG. 5 is a diagram showing an illustrative circuit schematic (500) of a source circuit which may be used to provide a perturbation current $I_P$ (504). According to certain illustrative embodiments, instead of applying a voltage across a resistor to create an electric current, electric current may be created through means of a current mirror. A source circuit which includes a number of load transistors (508) in parallel creates an electric current which may be mirrored by current mirror transistors (510). As will be appreciated by those skilled in the relevant art, the current sink circuit illustrated in FIG. 5 may be adjusted to operate as a current source circuit.

As mentioned above, a perturbation current (504) may be applied gradually by switching a number of transistors to an ON state when the transistors are placed in a parallel configuration. In some embodiments, the parallel set of transistors may be in a cascode configuration as shown in FIG. 5. A cascode configuration is often formed when the drain or source of a MOSFET device is connected to the drain or source terminal of another MOSFET device. In the case of a Bipolar Junction Transistor (BJT) device, the emitter or collector terminal of one BJT device is connected to the emitter or collector of another BJT device.

A current mirror is an electronic circuit designed to copy the electric current experienced by one device and create a similar electric current in another device. Current mirrors offer many benefits in circuit design. For example, the electric current being copied is unaffected by loads applied to the "copy" of the electric current. As shown in FIG. 5, the perturbation current (504) is formed by a number of load transistors (508) in a cascode configuration. A current mirror may be designed to create a scaled copy $I_M$ (506) of the perturbation current (504). The perturbation current (504) may then be determined by using an ADC (512) to take a measurement of the scaled copy (506) of the perturbation current (504). This configuration may offer higher source impedance as well as independence between the load and the perturbation current (504).

The above illustrated embodiments describe cases in which the precise value of the perturbation current is not important as long as it is measured accurately. However, in some embodiments, a precise perturbation current may be injected. Thus, a measurement of the perturbation current may not be required.

Figure 6:
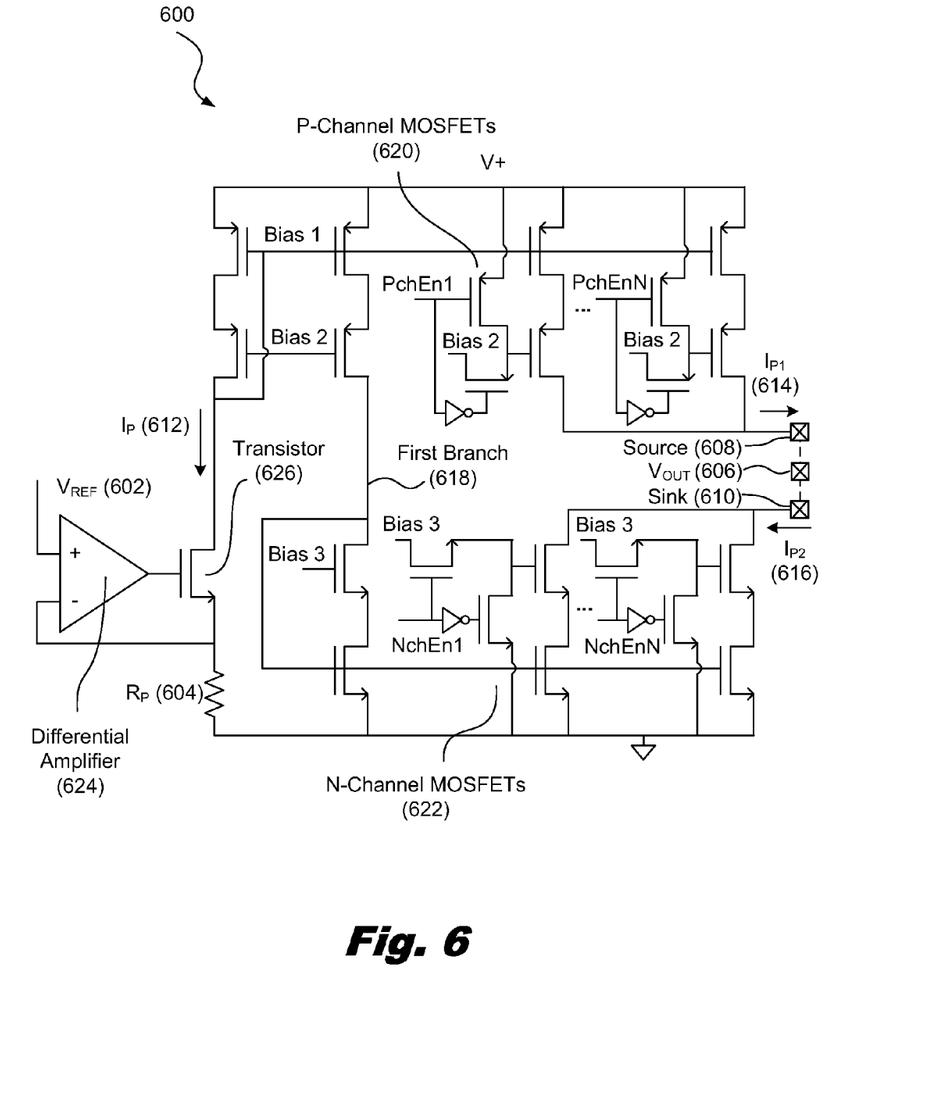
FIG. 6 is a diagram showing an illustrative circuit schematic of a circuit configured to apply a precise perturbation current, according to one embodiment of principles described herein.

FIG. 6 is a diagram showing an illustrative circuit schematic (600) of a circuit configured to apply a precise perturbation current. According to certain illustrative embodiments, a precise voltage reference $V_{REF}$ (602) may be applied to create a known perturbation current (612). A copy (614) of that perturbation current, optionally multiplied by a known factor (factor of "N" shown) may then be used by attaching Source (608) to the output node $V_{OUT}$ (606) of the circuit. Alternatively N-Channel MOSFETs could be used to create a similar current copy (616) that can be attached to the output node $V_{OUT}$ to sink a precision current.

The precise reference voltage may come from a variable voltage source such as a Digital-to-Analog Converter (DAC) or a fixed precision voltage. The precision voltage reference may then be compared against a voltage drop across a precision resistor (604). The voltage drop over the precision resistor (604) may be forced to be equal to the reference voltage (602) by the differential amplifier (624) attached to the gate of a transistor (626). The drain of the transistor (626) may be connected to the precision resistor (604).

The generated perturbation current (612) may then be copied by a number of current mirror circuit configurations to a first branch (618) as illustrated in FIG. 6. A number of p-channel MOSFET devices (620) may be used to create a source perturbation current (614). Likewise, a number of n-channel MOSFET devices (622) may be used to create a sink perturbation current (616) which may be equal in value to the source perturbation current (614). In some embodiments, both the source perturbation current (614) and the sink perturbation current (616) may be used to apply a perturbation current to a power supply circuit at a point prior to the current being sensed and remove the perturbation current at a point following the current sense element before it is applied to the load being driven by the power supply circuit.

Figure 7:
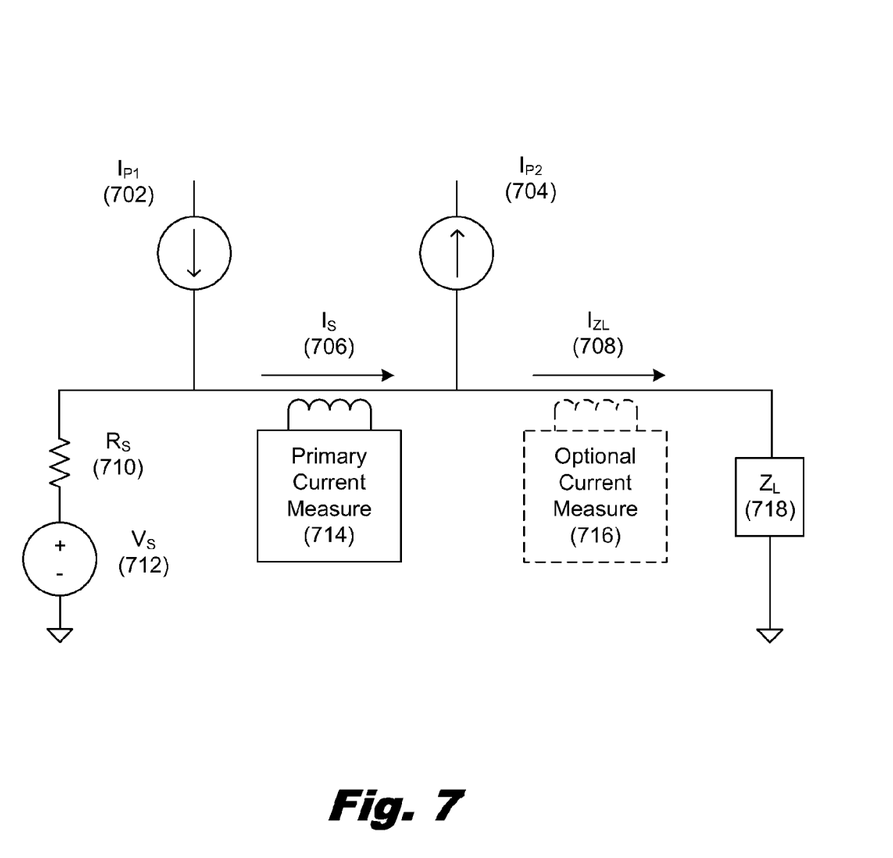
FIG. 7 is a diagram showing an illustrative circuit schematic of a system in which a perturbation current is removed before being applied to a load, according to one embodiment of principles described herein.

FIG. 7 is a diagram showing an illustrative circuit schematic (700) of a system in which a perturbation current is removed before being applied to a load. According to certain illustrative embodiments, a source circuit may apply a perturbation current $I_{P1}$ (702) may be applied to a system and added to a supply current (706). A current measuring element (714) may then measure the supply current in combination with the perturbation current (702). Before the supply current (706) reaches the load (718), a current sink may remove the perturbation current $I_{P2}$ (704) from the system. Conversely, in some embodiments, a sink circuit may apply a perturbation current and a source circuit may remove the perturbation current.

The supply current $I_S$ (706) may be created by any suitable voltage source represented as $V_S$ (712) in FIG. 7. A typical voltage source (712) includes a source resistance $R_S$ (710). The current measuring element (714) may include a variety of elements such as a resistor, an inductor, and/or a transistor.

By removing the perturbation current before it is applied to the load, the load may be less affected by fluctuations and spikes associated with the perturbation current. In some embodiments, an optional current measure device (716) may be present to measure the load current $I_{ZL}$ (708) supplied to the load (718). The optional current measuring element (716) may be used to observe the load current to determine how the perturbation current is affecting the load current.

Figure 8:
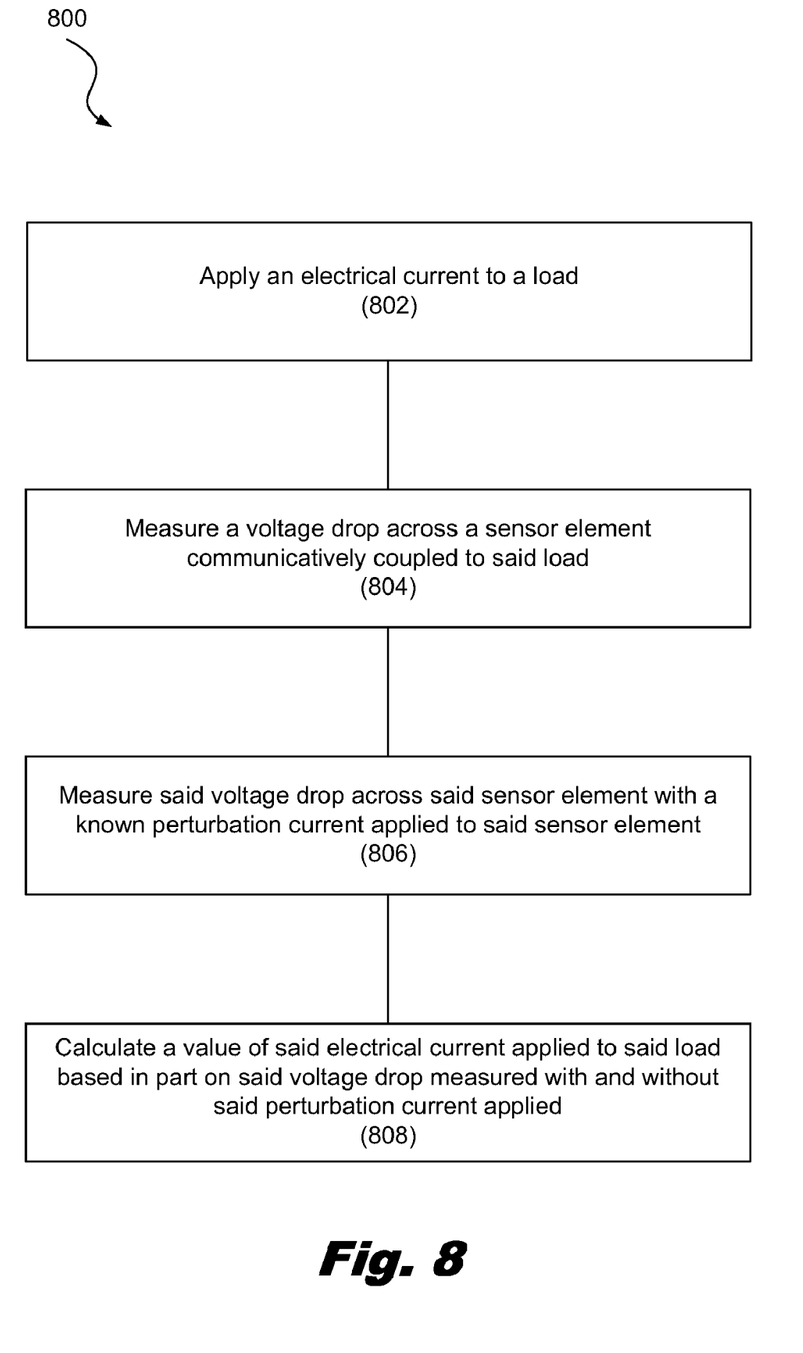
FIG. 8 is a flowchart showing an illustrative method for measuring current accurately through use of a perturbation current, according to one embodiment of principles described herein.

FIG. 8 is a flowchart showing an illustrative method (800) for measuring current accurately through use of a perturbation current. According to certain illustrative embodiments, the method may include applying (step 802) an electrical current to the load; measuring (step 804) the current using a sensor element communicatively coupled to the load; measuring (step 806) current using the sensor element with a known perturbation current applied to the sensor element; and compensating (step 808) for inaccuracies in the original sensor element measurement by making calculations based in part on change in current measured with and without the perturbation current applied.

In sum, by selectively applying a perturbation current and measuring the supply current with and without the perturbation current applied an accurate measurement of the supply current may be determined.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A method for measuring electric current applied to a load, the method comprising:
    with a sensor element having an inaccuracy, measuring an electric current supplied to a load to produce a measurement of said electric current;
    with said sensor element, measuring said electric current with an added perturbation current; and
    using measurements of said electric current taken with and without said perturbation current to refine said measurement of said electric current.

2. The method of claim 1, further comprising adjusting an impedance exhibited by said load in response to said measurement being above a predetermined threshold.

3. The method of claim 1, further comprising removing at least a part of said perturbation current applied to said sensor such that fluctuation of electric current from a source element supplying said electric current is reduced.

4. The method of claim 1, in which said sensor element is one of: a resistor, an inductor, a hall-effect sensor, and a Metal-Oxide Silicon Field Effect Transistor (MOSFET) device.

5. The method of claim 1, in which said perturbation current is applied through a number of MOSFET devices in parallel, said MOSFET devices configured to be selectively switched.

6. The method of claim 5, in which said number of MOSFET devices further comprises a second layer of MOSFET devices in a cascode configuration.

7. The method of claim 1, in which said perturbation current is known by applying a precise current to said sensor element.

8. The method of claim 7, in which said precise current is a precisely scaled value of a known electric current.

9. The method of claim 1, in which said perturbation current known by measuring said perturbation current.

10. The method of claim 9, in which said perturbation current is measured with one of: an Analog-to-Digital Converter (ADC) or a Voltage-to-Frequency Converter (VFC).

11. The method of claim 1, in which a temperature of said sensor element is further used to refine said measurement of said electric current.

12. The method of claim 1, in which said perturbation current is applied with a switched mode power supply.

13. The method of claim 1, in which said perturbation is applied to said sensor element gradually.

14. The method of claim 1, in which said perturbation current affects said sensor element at varied time intervals, the method further comprising measuring said electric current with said perturbation applied during more than one of said time intervals to further refine said measurement of said electric current.

15. The method of claim 14, in which said time intervals are of varying duration.

16. The method of claim 1, further comprising using said sensor element to detect load fluctuations to further refine said measurement of said current.

17. The method of claim 1, in which a known relationship of said electric current to a voltage of said load is used to refine said measurement of said electric current by accounting for voltage fluctuations in said load.

18. The method of claim 1, in which measurements taken with varying amounts of perturbation current affecting said sensor element are used to further refine said measurement of said electric current.

19. The method of claim 18, in which said measurements taken with said varying amounts of perturbation current aid in determining at least one of an offset, a gain, and a nonlinearity of said sensor element.

20. The method of claim 1, further comprising determining values of additional circuit parameters based in part on measurements taken with and without said perturbation current affecting said sensor element.

21. The method of claim 1, further comprising using a response of one of: said electric current and a voltage of said load to said perturbation current to improve regulation of a source element supplying said electric current.

22. An electronic circuit capable of measuring electric current applied to a load, the circuit comprising:
    a sensor element having an inaccuracy configured to measure an electric current being supplied to a load; and
    a perturbation source element configured to apply a perturbation current across said sensor element;
    in which said sensor element is configured to measure said electric current being supplied to across said sensor element with and without said perturbation current being applied to refine said measurement of said electric current.

23. The circuit of claim 2, further comprising circuitry to adjust an impedance exhibited by said load in response to said measurement being above a predetermined threshold.

24. The circuit of claim 22, further comprising a sink circuit to remove at least a part of said perturbation current applied to said sensor such that fluctuation of electric current from a source element supplying said electric current is reduced.

25. The circuit of claim 22, in which said sensor element is one of: a resistor, an inductor, a hall-effect sensor, and a Metal-Oxide Silicon Field Effect Transistor (MOSFET) device.

26. The circuit of claim 22, in which said perturbation current is applied through a number of MOSFET devices in parallel, said MOSFET devices configured to be selectively switched.

27. The circuit of claim 22, in which said perturbation current is known by applying a precise current to said sensor element.

28. The circuit of claim 27, in which said precise current is a precisely scaled value of a known electric current.

29. The circuit of claim 22, in which said perturbation current known by measuring said perturbation current with one of: an Analog-to-Digital Converter (ADC) and a Voltage-to-Frequency Converter (VFC).

30. The circuit of claim 22, further comprising circuitry configured to take a temperature measurement, said temperature measurement used to refine said measurement of said electric current.

31. The circuit of claim 22, in which said sensor element is further configured to use said sensor element to detect load fluctuations to further refine said measurement of said current.

32. The circuit of claim 22, in which said perturbation source element is configured to affect said sensor element with varying amounts of perturbation current to further refine said measurement of said electric current.

33. The circuit of claim 32, in which said sensor element affected by said varying amounts of perturbation current aids in determining at least one of an offset, a gain, and a non-linearity of said sensor element.

34. The circuit of claim 32, in which said sensor element and circuitry associated with said perturbation source element are manufactured into one or more integrated circuits.

35. An electronic device comprising:
an electronic circuit configured to:
with a sensor element having an inaccuracy, measure an electric current supplied to a load to produce a measurement of said electric current;
with said sensor element, measure said electric current with an added perturbation current; and use measurements of said electric current taken with and without said perturbation current to refine said measurement of said electric current.

* * * * *